(12) United States Patent
Matsuo et al.

(10) Patent No.: US 9,515,603 B2
(45) Date of Patent: Dec. 6, 2016

(54) CRYSTAL OSCILLATOR START-UP CIRCUIT

(71) Applicant: Cypress Semiconductor Corporation, San Jose, CA (US)

(72) Inventors: Yoshihiko Matsuo, Yokohama (JP); Kimitoshi Niratsuka, Yokohama (JP)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/513,314

(22) Filed: Oct. 14, 2014

(65) Prior Publication Data
US 2016/0105147 A1   Apr. 14, 2016

(51) Int. Cl.
H03B 5/06 (2006.01)
H03B 5/36 (2006.01)
H03B 5/12 (2006.01)
H03L 7/00 (2006.01)

(52) U.S. Cl.
CPC .............. *H03B 5/06* (2013.01); *H03B 5/1212* (2013.01); *H03B 5/1228* (2013.01); *H03B 5/1243* (2013.01); *H03B 5/364* (2013.01); *H03L 7/00* (2013.01)

(58) Field of Classification Search
CPC ............... H03L 7/00; H03L 7/06; H03L 7/24; H03L 7/095; H03B 5/06; H03B 5/364
USPC ................... 331/47, 116 R, 154, 158
See application file for complete search history.

(56) References Cited

U.S. PATENT DOCUMENTS

| | | | | |
|---|---|---|---|---|
| 6,549,079 B1 * | 4/2003 | Crook | ................... | H03L 7/0898 331/14 |
| 6,664,860 B2 * | 12/2003 | Fallisgaard | ............ | H03B 5/366 331/18 |
| 7,425,852 B2 * | 9/2008 | Garzarolli | ................. | H03L 7/10 327/147 |
| 2003/0231065 A1 * | 12/2003 | Ito | ............. | H03L 3/00 331/1 A |
| 2014/0070897 A1 * | 3/2014 | Brekelmans | ............. | H03B 5/36 331/109 |

FOREIGN PATENT DOCUMENTS

JP    2009-188738    8/2009

* cited by examiner

*Primary Examiner* — Jeffrey Shin

(57) ABSTRACT

A crystal oscillator start-up circuit capable of reducing a start-up time of a crystal oscillator is disclosed. The crystal oscillator start-up circuit is provided with a crystal oscillation unit including a crystal oscillator, a converter and an external oscillator. The crystal oscillation unit generates an output signal corresponding to the impedance characteristic of the crystal oscillator. The converter converts the output signal of the crystal oscillation unit to a voltage signal. The external oscillator outputs to the crystal oscillation unit an oscillation signal whose frequency is adjusted by the voltage signal to approach a resonance frequency of the crystal oscillator.

15 Claims, 17 Drawing Sheets

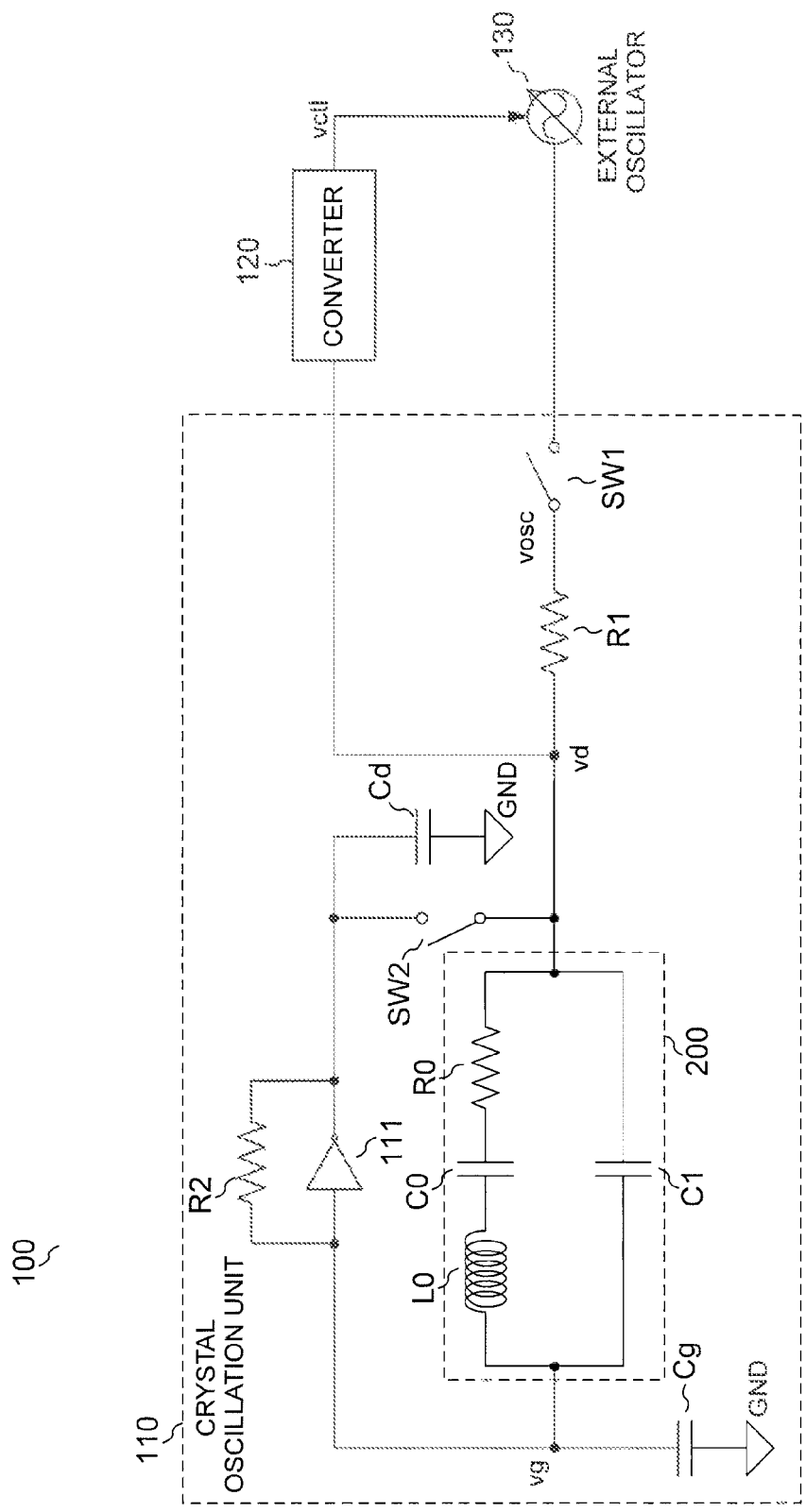

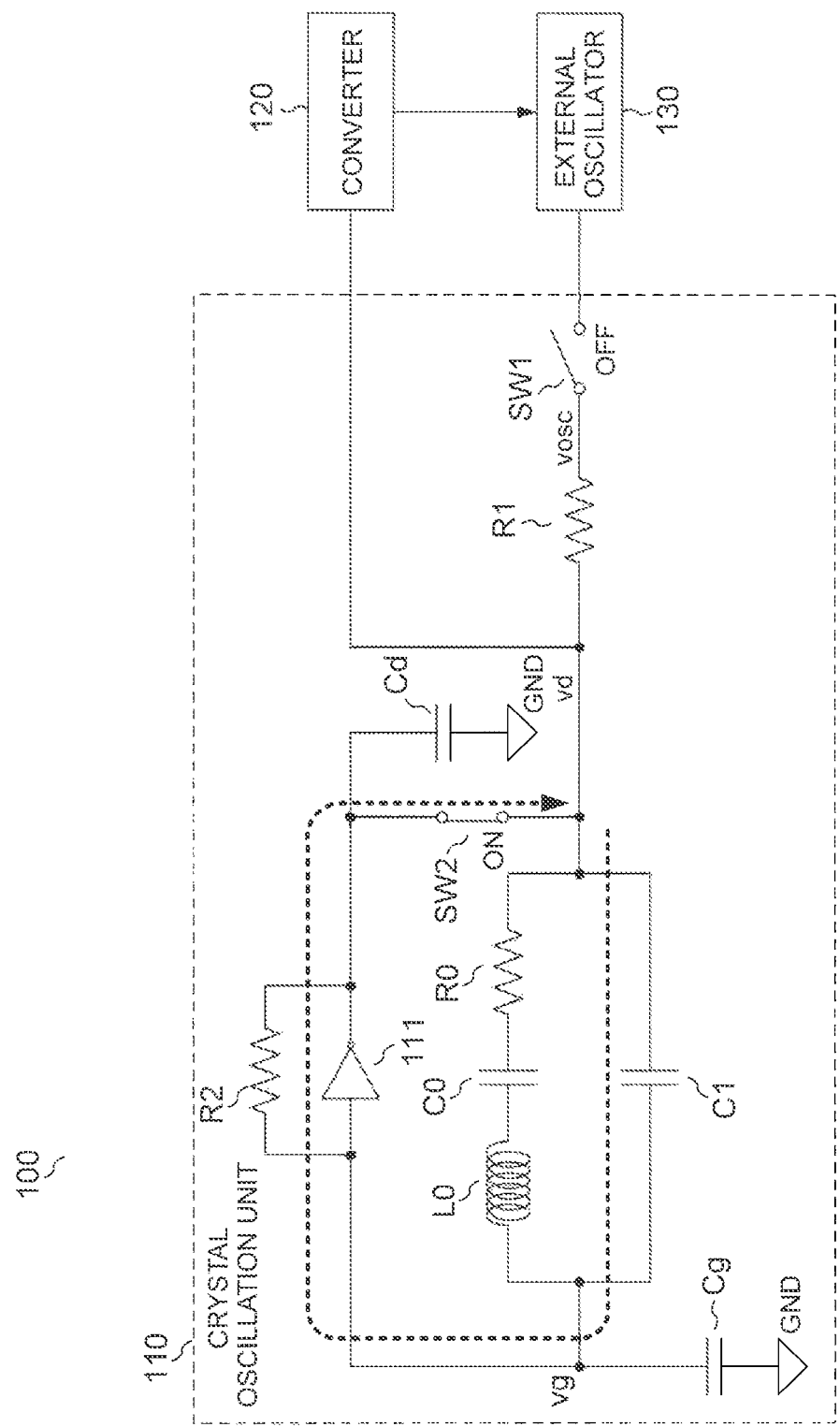

CRYSTAL OSCILLATOR START-UP CIRCUIT

BACKGROUND

In a crystal oscillation circuit, a crystal oscillator starts vibrating when a voltage is applied to the crystal oscillator. As the amplitude of the vibration gradually increases with time and the vibration is stabilized, the crystal oscillation circuit is made available to an external circuit. That is, the crystal oscillation circuit requires a start-up time.

Japanese Patent Application Publication No. 2009-188738 describes a method for exciting a crystal oscillator using a voltage-controlled oscillator to shorten a start-up time. However, there is a need to match the frequency of the voltage-controlled oscillator, provided externally, with the resonance frequency of the crystal oscillator according to trimming, temperature correction, etc. When the Q value of the crystal oscillator is high, it is difficult to apply the method.

SUMMARY

The present invention provides a crystal oscillator start-up circuit capable of reducing a start-up time of a crystal oscillation unit, and a method for starting up the crystal oscillation unit.

A crystal oscillator start-up circuit according to one aspect of the present invention is provided with a crystal oscillation unit including a crystal oscillator, a converter and an external oscillator. The crystal oscillation unit generates an output signal corresponding to the impedance characteristic of the crystal oscillator. The converter converts the output signal of the crystal oscillation unit to a voltage signal. The external oscillator outputs to the crystal oscillation unit an oscillation signal whose frequency is adjusted by the voltage signal to approach the resonance frequency of the crystal oscillator.

A method for starting up a crystal oscillation unit, according to one aspect of the present invention includes the steps of generating an output signal corresponding to an impedance characteristic of a crystal oscillator included in the crystal oscillation unit, converting the output signal of the crystal oscillation unit to a voltage signal, and outputting, from an external oscillator to the crystal oscillation unit, an oscillation signal whose frequency is adjusted by the voltage signal to approach a resonance frequency of the crystal oscillator.

BRIEF DESCRIPTION OF THE DRAWINGS

The accompanying drawings are incorporated herein and form a part of the specification.

FIG. 3 is a diagram illustrating a configuration of the crystal oscillator start-up circuit illustrated in FIG. 1, according to an example embodiment.

FIG. 4A and FIG. 4B are diagrams for describing operation of the crystal oscillator start-up circuit illustrated in FIG. 3, according an example embodiment.

In the drawings, like reference numbers generally indicate identical or similar elements. Additionally, generally, the left-most digit(s) of a reference number identifies the drawing in which the reference number first appears.

DETAILED DESCRIPTION

The present embodiment relates to a crystal oscillator start-up circuit for starting up a crystal oscillation unit including a crystal oscillator, and particularly aims to reduce the start-up time of the crystal oscillation unit. The method for realizing the crystal oscillator start-up circuit is not limited to the following embodiments, but can be carried out in other various forms within the scope not departing from the gist of the present disclosure. The present embodiment is an illustration in all respects and is not intended to be construed as being limited to configurations, sizes, etc., disclosed herein.

1. Circuit Configuration 1.1 Summary of Circuit Configuration

Figure 1:
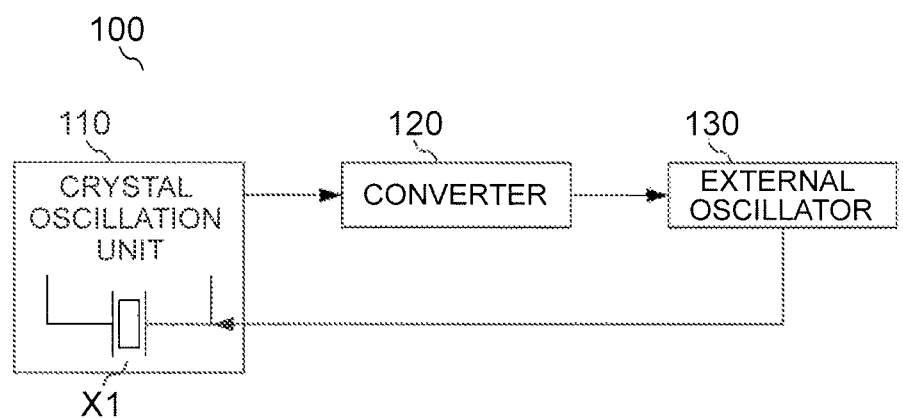
FIG. 1 is a diagram illustrating a configuration of a crystal oscillator start-up circuit, according to an example embodiment.

FIG. 1 is a diagram illustrating a configuration of a crystal oscillator start-up circuit 100, according to an embodiment. The crystal oscillator start-up circuit 100 includes a crystal oscillation unit 110, which includes a crystal oscillator X1, a converter 120 and an external oscillator 130. Configuration examples of crystal oscillation unit 110, converter 120 and external oscillator 130 will be described later with reference to FIGS. 4A, 4B, 6A, 7A, 8 and 9.

Crystal oscillation unit 110 includes crystal oscillator X1 and outputs an oscillation state to converter 120 as an output signal, using the impedance frequency characteristic of crystal oscillator X1. When the oscillation frequency approaches the resonance frequency of crystal oscillator X1, the amplitude of the voltage outputted from crystal oscillation unit 110, i.e., its output voltage, is reduced.

Converter 120 converts the output signal from crystal oscillation unit 110 to a voltage signal corresponding to the impedance characteristic of crystal oscillator X1 and outputs the voltage signal as a control signal to external oscillator 130.

External oscillator 130 outputs to crystal oscillation unit 110 an external oscillation signal, whose frequency is based on the control signal. That is, external oscillator 130 outputs to crystal oscillation unit 110 an external oscillation signal, whose frequency is adjusted to approach the resonance frequency of crystal oscillator X1 according to the control signal. Thus, external oscillator 130 brings the oscillation frequency of crystal oscillator X1 close to its resonance frequency.

1.2 Summary of Operation

Figure 2:
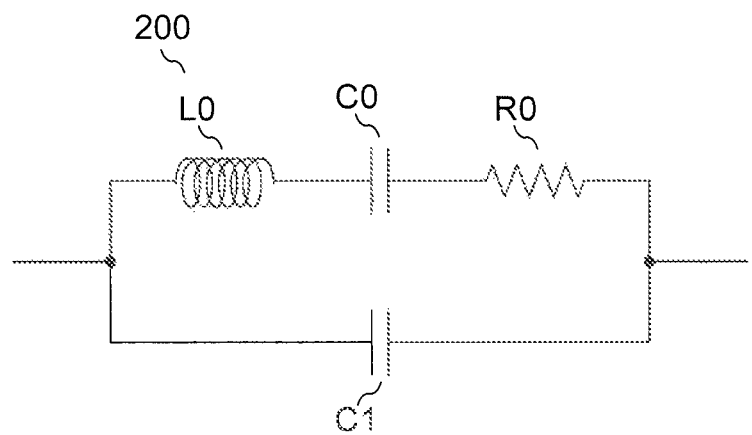
FIG. 2 is a diagram illustrating an equivalent circuit of a crystal oscillator, according to an example embodiment.

A summary of the operation of crystal oscillator start-up circuit 100, according to an embodiment, will hereinafter be described with reference to FIG. 2 through FIG. 4B. In order to describe the operation, crystal oscillator X1 will be replaced with an equivalent circuit 200, as shown in FIG. 2.

Equivalent circuit 200 of crystal oscillator X1 includes an inductor L0, a capacitor C0, a resistor R0 and a capacitor C1. Inductor L0, capacitor C0 and resistor R0 are connected in series. The series connection of inductor L0, capacitor C0 and resistor R0 is connected in parallel with capacitor C1.

FIG. 3 illustrates an example in which crystal oscillator X1 is replaced with equivalent circuit 200 in crystal oscillator start-up circuit 100.

One end of equivalent circuit 200 is grounded via a capacitor Cg. The other end of equivalent circuit 200 is grounded via a switch SW2 and a capacitor Cd. The voltage at a node to which one end of equivalent circuit 200 and the capacitor Cg are connected is labeled vg. A voltage at the node to which the other end of equivalent circuit 200 and the switch SW2 are connected is labeled vd.

An inverter 111 and a resistor R2 are connected in parallel. An input end of inverter 111 and one end of resistor R2 are connected to node vg. An output end of inverter 111 and the other end of resistor R2 are grounded via capacitor Cd and connected to one end of switch SW2.

Node vd is connected to external oscillator 130 through a resistor R1 and a switch SW1. Further, the node vd is connected to converter 120. A voltage at the node to which resistor R1 and switch SW1 are connected is labeled vosc.

An impedance Z of the crystal oscillator X1, using equivalent circuit 200, may be expressed as in the following equation (1):

$$Z=\sqrt{R_0^2+(\omega L_0-(1/\omega C_0))^2} \quad (1)$$

When the resonance frequency of crystal oscillator X1 is taken as or, i.e. when $\omega=\omega r$, the following equation (2) may be established:

$$Z=R_0 \quad (2)$$

Voltage vd, equivalent to the output signal from crystal oscillation unit 110, may be expressed in the following equation (4), given the condition of equation (3):

$$Z \gg 1/\omega C_g \quad (3)$$

$$vd \frac{Z+(1/\omega C_g)}{R_1+Z+(1/\omega C_g)} vosc \approx \frac{Z}{R_1+Z} vosc \quad (4)$$

Figure 4A:
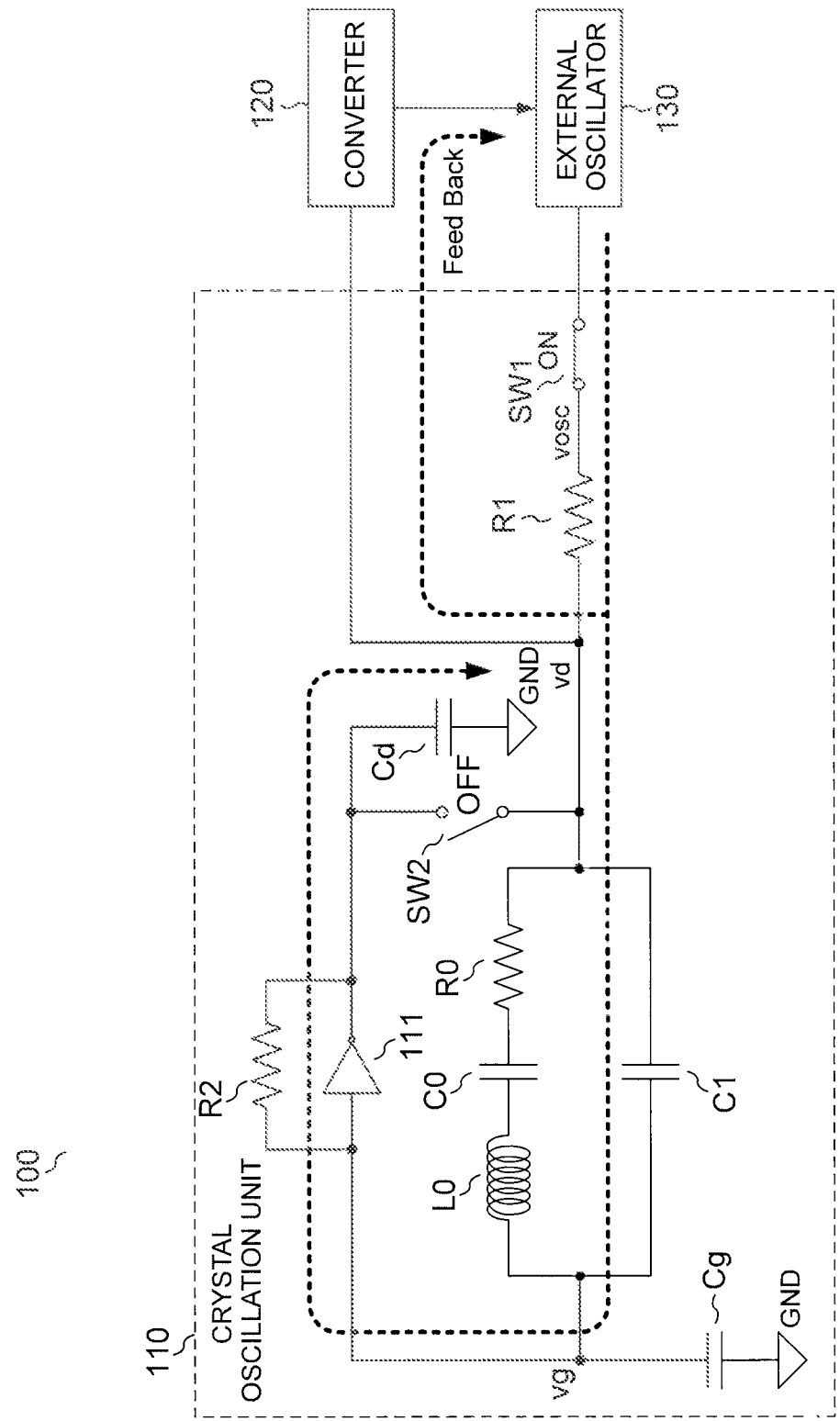

In crystal oscillator start-up circuit 100 shown in FIG. 3, at start-up, external oscillator 130 first outputs to crystal oscillation unit 110 an external oscillation signal, in the form of voltage vosc, for oscillating crystal oscillator X1. During this period, switch SW1 is controlled to be ON, and switch SW2 is controlled to be OFF, as shown in FIG. 4A. Since resistor R1 is connected between nodes vd and vosc, the frequencies and phases of voltages vosc and vd coincide.

Figure 5:
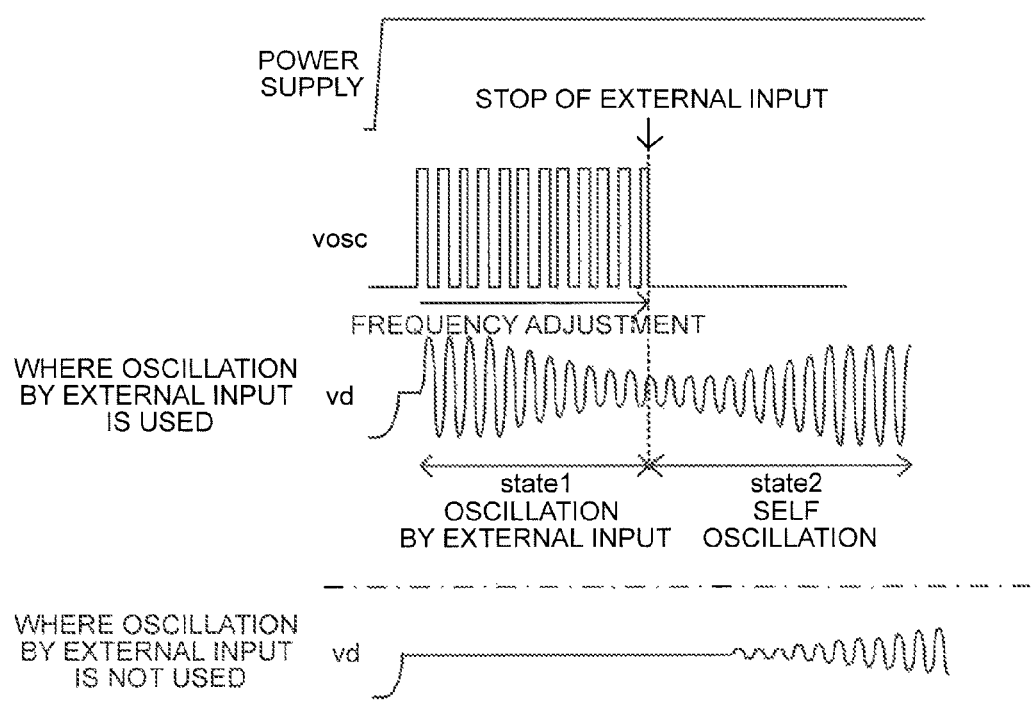
FIG. 5 is a diagram illustrating example signal waveforms of the crystal oscillator start-up circuit illustrated in FIG. 3.

At this time, according to equations (1) and (4), the amplitude of voltage vd decreases, as shown by a period state 1 in FIG. 5, as the impedance of crystal oscillator X1 decreases when the input frequency from external oscillator 130 approaches the resonance frequency or of crystal oscillator X1. Converter 120 sets a voltage vctl as a control signal to external oscillator 130 in such a manner that the amplitude of voltage vd decreases after having detected voltage vd. External oscillator 130 outputs voltage vosc as the external oscillation signal based on control signal vctl. As a result, the frequency of crystal oscillation unit 110 approaches the resonance frequency of the crystal oscillator X1.

When the amplitude of the voltage vd is lowered to a particular threshold, crystal oscillator start-up circuit 100 switches to an internal oscillation by crystal oscillation unit 110. More specifically, switch SW1 is turned OFF and switch SW2 is turned ON, as shown in FIG. 4B. A period state 2 in FIG. 5 corresponds to the internal oscillation. Since the switch SW1 is OFF during this period, voltage vosc is zero.

When the external oscillation by external oscillator 130 is not used during the period state 1, as shown in the bottom waveform in FIG. 5, it takes relatively longer to stabilize the vibrations of crystal oscillator X1 as compared with the case where external oscillator 130 is used.

1.3 Configuration Examples of Converter 120

Circuit configuration examples and signal waveforms of converter 120 included in crystal oscillator start-up circuit 100 will subsequently be described with reference to FIGS. 6A through 7B. Converter 120 converts an output signal corresponding to an impedance frequency characteristic from the crystal oscillation unit 110 to an output signal vctl for controlling external oscillator 130.

1.3.1 First Configuration Example of Converter 120

Figure 6A:
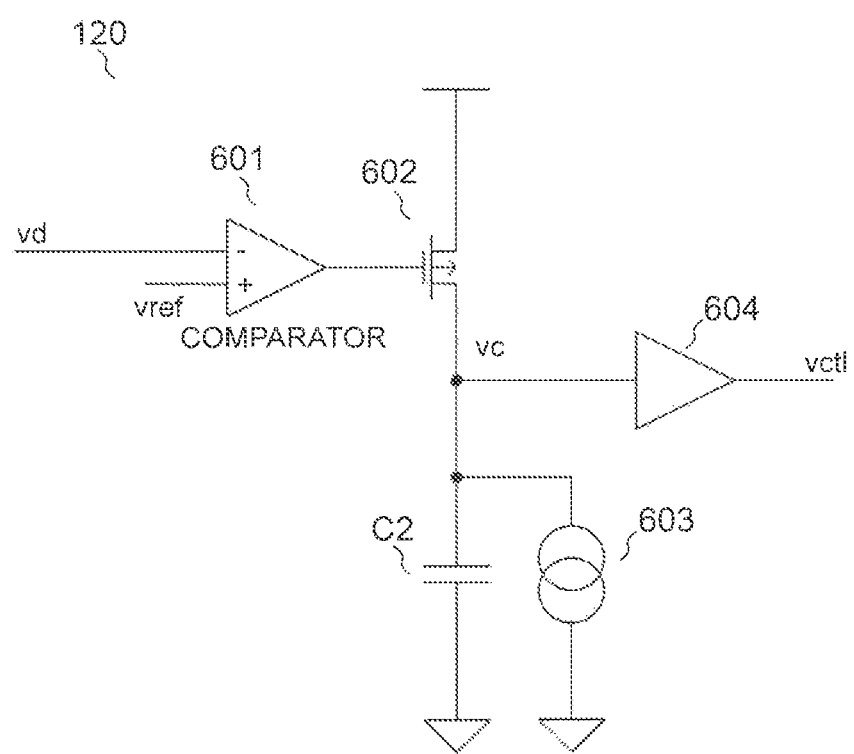
FIG. 6A is a diagram illustrating a configuration of a part of the crystal oscillator start-up circuit illustrated in FIG. 1, according to an example embodiment.

FIG. 6A is a diagram illustrating a first circuit configuration example of converter 120, according to an embodiment. In the example of FIG. 6A, converter 120 includes a comparator 601, a p-channel MOSFET 602, a capacitor C2, a current source 603 and a buffer amplifier 604.

An inversion input terminal of the comparator 601 is connected to the node vd of crystal oscillator start-up circuit 100. That is, the inversion input terminal receives the voltage level at one end of crystal oscillator X1. A non-inversion input terminal of comparator 601 is supplied with a threshold voltage vref. The output of comparator 601 is connected to a gate of p-channel MOSFET 602.

A source of p-channel MOSFET 602 is connected to a power supply voltage. A drain of p-channel MOSFET 602 is grounded via capacitor C2 and current source 603, respectively, and connected to an input end of the buffer amplifier 604. A voltage at the drain of p-channel MOSFET 602 is labeled vc. The buffer amplifier 604 outputs a voltage vctl as a control signal to external oscillator 130.

Figure 6B:
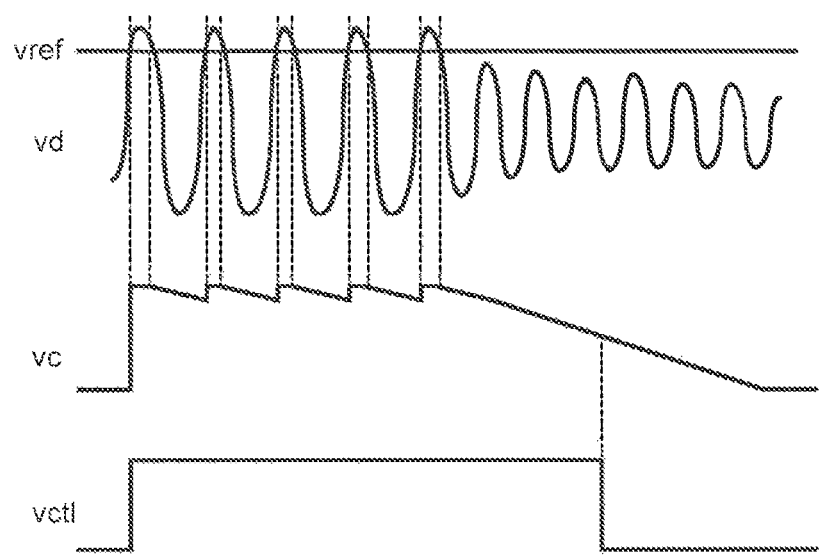
FIG. 6B is a diagram illustrating example signal waveforms of the circuit illustrated in FIG. 6A.

Voltage waveforms related to converter 120 shown in FIG. 6A are illustrated in FIG. 6B. Comparator 601 compares input voltage vd with threshold voltage vref. When input voltage vd exceeds threshold voltage vref, voltage vc reaches a prescribed level and, correspondingly, output voltage vctl also becomes high.

Thereafter, when input voltage vd falls below threshold voltage vref, voltage vc decreases gradually. When voltage vc is lowered to a predetermined level or less, output voltage vctl is also reduced to low. Incidentally, switches SW1 and SW2 included in crystal oscillator start-up circuit 100 can be controlled according to the level of voltage vctl. More specifically, when voltage vctl is high, switch SW1 can be turned ON, and switch SW2 can be turned OFF. When the voltage vctl is at the low, switch SW1 can be turned OFF, and the switch SW2 can be turned ON. This point is similar to a second configuration example described below.

1.3.2 Second Configuration Example of Converter 120

Figure 7A:
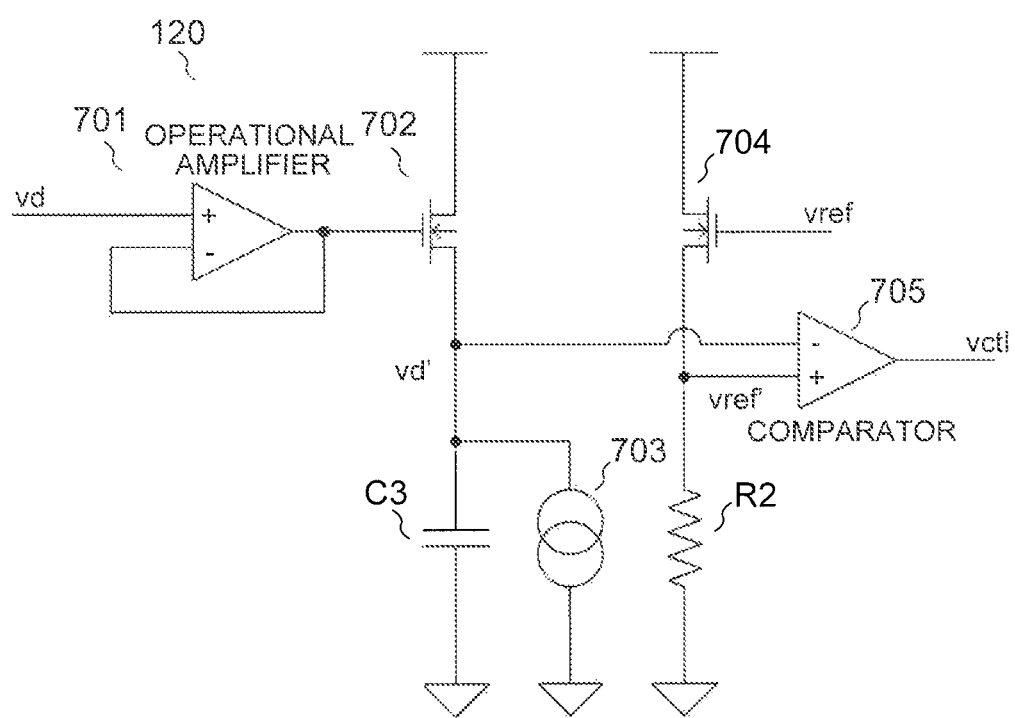
FIG. 7A is a diagram illustrating a configuration of a part of the crystal oscillator start-up circuit illustrated in FIG. 1, according to an example embodiment.

FIG. 7A is a diagram illustrating a second circuit configuration example of converter 120, according to an embodiment. In the example of FIG. 7A, converter 120 includes an operational amplifier 701, n-channel MOSFETs 702 and 704, a capacitor C3, a current source 703, a resistor R2 and a comparator 705.

A non-inversion input terminal of operational amplifier 701 is connected to node vd of crystal oscillator start-up circuit 100. That is, the non-inversion input terminal receives the input of a voltage level at one end of crystal oscillator X. An output end of operational amplifier 701 is fed back to the inversion input terminal and connected to a gate of n-channel MOSFET 702.

A source of n-channel MOSFET 702 is connected to a power supply voltage. A drain of n-channel MOSFET 702 is grounded via capacitor C3 and current source 703, respectively, and connected to an inversion input terminal of comparator 705. A voltage at the drain of n-channel MOSFET 702 is labeled vd'.

A source of n-channel MOSFET 704 is connected to the power supply voltage, and a gate thereof is connected to a threshold voltage vref. A drain of n-channel MOSFET 704 is grounded via resistor R2 and connected to a non-inversion input terminal of comparator 705. A voltage at the drain of n-channel MOSFET 704 is labeled vref'. Comparator 705 outputs a voltage vctl as a control signal to external oscillator 130.

Figure 7B:
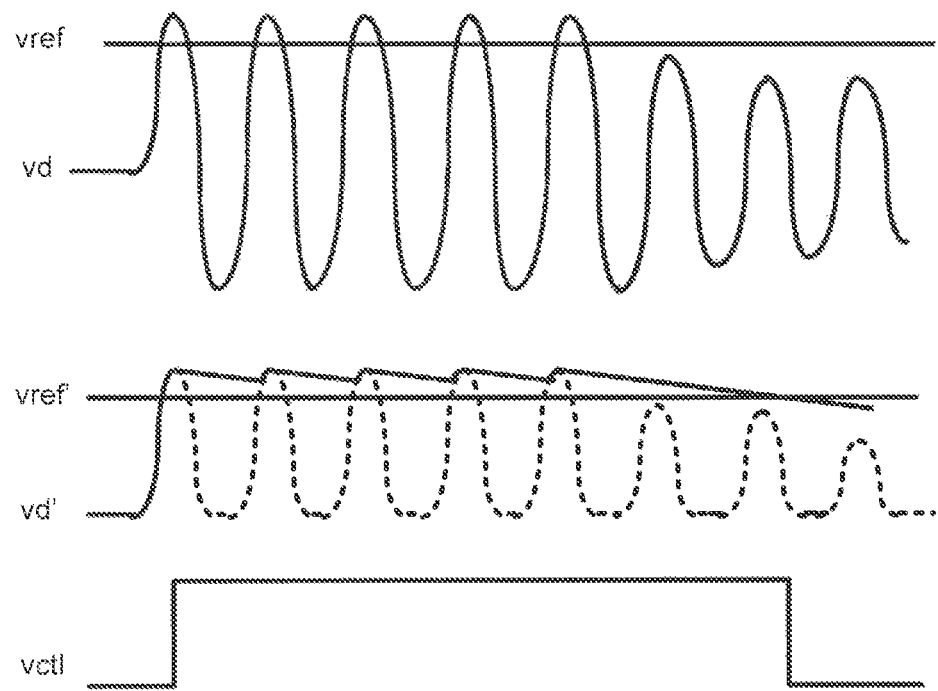
FIG. 7B is a diagram illustrating example signal waveforms of the circuit illustrated in FIG. 7A.

Voltage waveforms related to converter 120 shown in FIG. 7A are illustrated in FIG. 7B. As shown in FIG. 7B, when input voltage vd rises at the start-up of crystal oscillator start-up circuit 100, the voltage level of voltage vd' also rises correspondingly. When the voltage level of voltage vd' becomes greater than or equal to voltage vref, output voltage vctl becomes high.

Thereafter, when the level of the peak voltage of input voltage vd decreases gradually, the level of voltage vd' decreases. When the level of voltage vd' becomes less than or equal to the voltage vref', the output voltage vctl is reduced to low.

1.4 Configuration Examples of External Oscillator 130

Configuration examples of external oscillator 130 included in crystal oscillator start-up circuit 100 will next be described with reference to FIGS. 8 and 9.

1.4.1 First Configuration Example of External Oscillator 130

Figure 8:
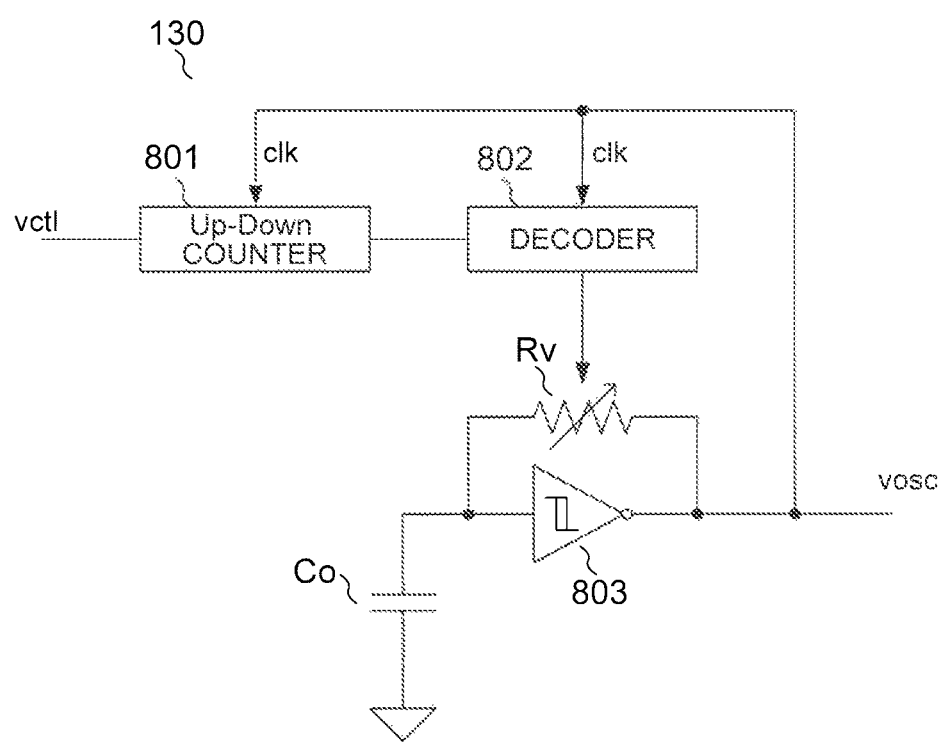
FIG. 8 is a diagram illustrating a configuration of a part of the crystal oscillator start-up circuit illustrating in FIG. 1, according to an example embodiment.

FIG. 8 is a diagram illustrating a first configuration example of external oscillator 130, according to an embodiment. In the example of FIG. 8, external oscillator 130 includes an Up-Down counter 801, a decoder 802, a variable resistor Rv, a capacitor Co and a Schmitt inverter 803.

Up-Down counter 801 receives as input control voltage vctl from converter 120 and a clock signal clk. Up-Down counter 801 counts up or down clock signal clk according to the state (high/low level) of control voltage vctl. Decoder 802 receives as input clock signal clk and a signal from Up-Down counter 801, and changes the resistance value of the variable resistor Rv according to the input signal from Up-Down counter 801.

The variable resistor Rv is connected in parallel with Schmitt inverter 803 and has one end grounded via capacitor Co and the other end connected to an output node vosc. Voltage vosc is the same as clock signal clk.

Schmitt inverter 803 has an input end grounded via capacitor Co and an output end connected to output node vosc.

Voltage vosc of external oscillator 130 becomes a rectangular wave, and the oscillation frequency of the rectangular wave is inversely proportional to the product of capacitor Co and variable resistor Rv. Thus, decoder 802 is capable of adjusting the frequency of voltage vosc by changing the resistance value of variable resistor Rv. That is, external oscillator 130 is capable of adjusting the frequency of voltage vosc according to control voltage vctl.

1.4.2 Second Configuration Example of External Oscillator 130

Figure 9:
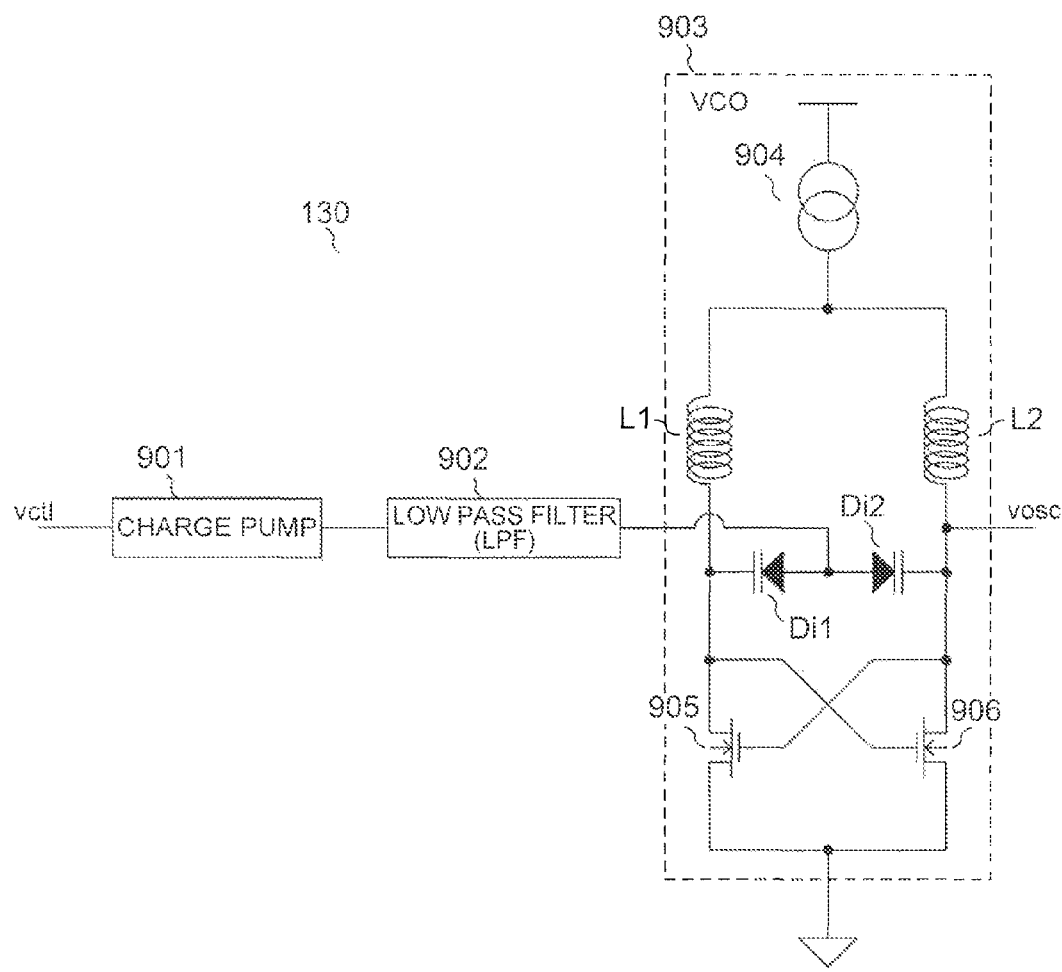
FIG. 9 is a diagram illustrating a configuration of a part of the crystal oscillator start-up circuit illustrated in FIG. 1, according to an example embodiment.

FIG. 9 is a diagram illustrating a second configuration example of external oscillator 130, according to an embodiment. In the example of FIG. 9, external oscillator 130 includes a charge pump 901, a low pass filter 902 and a VCO (Voltage Controlled Oscillator) 903.

Charge pump 901 generates an UP-DOWN pulse according to input voltage vctl. Low pass filter 902 smooths a signal outputted from the charge pump 901. A voltage outputted from low pass filter 902 is inputted to VCO 903.

VCO 903 is an oscillator that outputs a voltage vosc as an output oscillation signal having an oscillation frequency corresponding to the voltage from low pass filter 902. VCO 903 includes a current source 904, inductors L1 and L2, variable capacitance diodes Di1 and Di2 and n-channel MOSFETs 905 and 906.

Anodes of variable capacitance diodes Di1 and Di2 are connected to each other and connected to an output end of low pass filter 902. A cathode of variable capacitance diode Di1 is connected to one end of inductor L1, a source of n-channel MOSFET 905 and a gate of n-channel MOSFET 906. A cathode of variable capacitance diode Di2 is connected to one end of inductor L2, a source of n-channel MOSFET 906 and a gate of n-channel MOSFET 905. Drains of n-channel MOSFETs 905 and 906 are grounded.

A power supply voltage is connected to the other ends of inductors L1 and L2 via current source 904. The other ends of inductors L1 and L2 are connected to each other.

One end of inductor L2, the cathode of variable capacitance diode Di2, the gate of n-channel MOSFET 905 and the source of n-channel MOSFET 906 are connected to a node vosc that serves as an output end.

In the example of FIG. 9, since the electrostatic capacitances of variable capacitance diodes Di1 and Di2 change according to input voltage vctl, the frequency of output signal vosc outputted from external oscillator 130 changes correspondingly.

1.5 Effects According to the Present Embodiment

As described above, in crystal oscillator start-up circuit 100, voltage vctl, which is a voltage signal generated by converter 120 based on voltage vd from crystal oscillation unit 110, is inputted to external oscillator 130 upon start-up. According to voltage vctl, external oscillator 130 adjusts the frequency of output voltage vosc, corresponding to the external oscillation signal, to approach the resonance frequency of crystal oscillation unit 110. The adjusted output signal vosc is inputted to crystal oscillation unit 110. Since crystal oscillation unit 110 is excited by voltage vosc, the start-up speed of crystal oscillation unit 110, i.e., the time taken for crystal oscillation unit 110 to oscillate stably, is shortened. Further, since external oscillator 130 adjusts the frequency of the output oscillation signal based on the output signal from crystal oscillation unit 110, i.e., external oscillator 130 performs feedback control, crystal oscillation unit 110 can be properly excited.

2. Modifications

Modifications will be described below.

2.1 First Modification

A crystal oscillation unit is often used in conjunction with a phase locked loop (PLL). The oscillation frequency of the crystal oscillation unit may be multiplied by 1/N to obtain an arbitrary frequency. The PLL may be configured to include a VCO (Voltage Controlled Oscillator). Thus, in the first modification, the PLL including the VCO may be used as the external oscillator 130 shown in the above embodiments.

Figure 10:
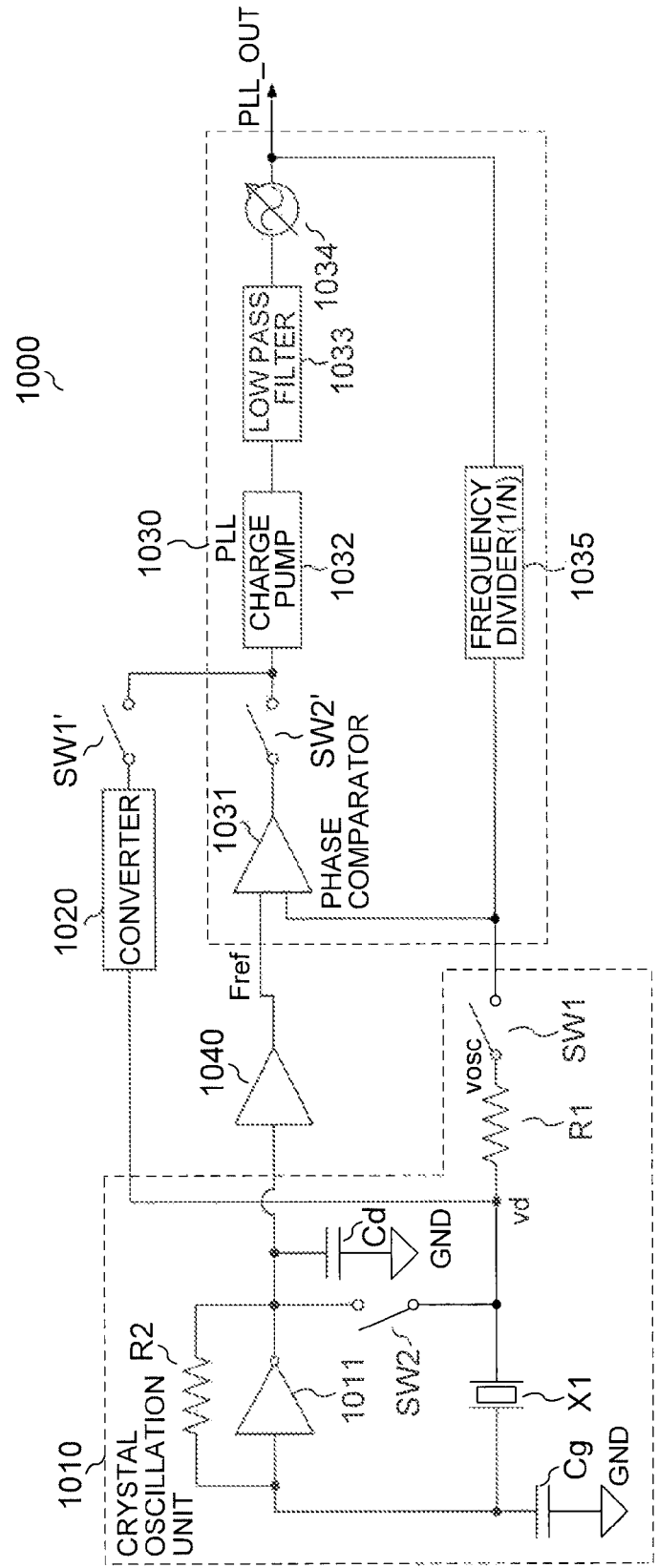
FIG. 10 is a diagram illustrating a crystal oscillator start-up circuit according to a first modification, according to an example embodiment.

FIG. 10 illustrates a configuration example of a crystal oscillator start-up circuit 1000, according to the first modification. The crystal oscillator start-up circuit 1000 includes a crystal oscillation unit 1010, a converter 1020, a PLL 1030 and a buffer amplifier 1040.

Descriptions of crystal oscillation unit 1010 and circuit configuration examples thereof will be omitted since their operations are similar to those of crystal oscillation unit 110 of crystal oscillator start-up circuit 100 in the above embodiments.

Since operation of converter 1020 and circuit configuration examples thereof are also similar to those of converter 120 of the crystal oscillator start-up circuit 100 in the above embodiment, their description will be omitted. An output signal outputted from converter 1020 is inputted to PLL 1030 via a switch SW1'.

PLL 1030 has the function of multiplying an oscillation frequency outputted from crystal oscillation unit 1010 by 1/N. At start-up of crystal oscillation unit 1010, PLL 1030 outputs to crystal oscillation unit 1010 an external oscillation signal whose frequency is adjusted according to the control signal from converter 1020. Thus, when crystal oscillation unit 1010 is started up, an operation similar to external oscillator 130 in the above embodiments may be obtained.

PLL 1030 includes a phase comparator 1031, a switch SW2', a charge pump 1032, a low pass filter 1033, a VCO 1034 and a frequency divider 1035.

Phase comparator 1031 receives as inputs a reference signal Fref from buffer amplifier 1040 and a signal outputted from frequency divider 1035. Phase comparator 1031 outputs a signal obtained by converting a phase difference between the inputs to a voltage.

Incidentally, here, buffer amplifier 1040 is connected to a crystal oscillator X1 via a switch SW2 included in crystal oscillation unit 1010. Since buffer amplifier 1040 is for amplifying an output signal, when switch SW2 is turned ON, reference signal Fref is an amplified version of a voltage vd, which is an output signal oscillated by crystal oscillator X1.

Switches SW2' and SW1' are a mechanism for switching signals supplied to charge pump 1032. In order to cause PLL 1030 to function as the external oscillator at the start-up of crystal oscillation unit 1010, switch SW1' is turned ON and switch SW2' is turned OFF. On the other hand, after the input of the external oscillation signal to crystal oscillation unit 1010 is stopped, switch SW2' is turned ON and switch SW1' is turned OFF and PLL 1030 may be used for its original intended function.

Charge pump 1032 boosts the signal from converter 1020 or the signal from phase comparator 1031. Low pass filter 1033 removes high-frequency content from the signal outputted by charge pump 1032.

VCO 1034 is an oscillator which outputs an output signal PLL_OUT of a frequency corresponding to the voltage from low pass filter 1033. A circuit configuration of VCO 1034 may be implemented in various ways, but, for example, a circuit configuration similar to VCO 903 in FIG. 9 may be applied. When switch SW1' is ON and switch SW2' is OFF, the voltage corresponding to the control signal outputted from converter 1020 is supplied to VCO 1034. Since the output signal from converter 1020 corresponds to the oscillation frequency of the crystal oscillator X1 as described previously, VCO 1034 adjusts the frequency of output signal PLL_OUT in such a manner that the frequency of the signal outputted from frequency divider 1035 approaches the resonance frequency of crystal oscillator X1.

On the other hand, when switch SW1' is OFF and switch SW2' is ON, the voltage corresponding to the output signal from phase comparator 1031 is supplied to VCO 1034. The output signal from phase comparator 1031 is the voltage corresponding to the phase difference between the output signal of the frequency divider 1035 and the reference signal Fref as described above. Thus, at this time, VCO 1034 adjusts the frequency of output signal PLL_OUT to synchronize the phase of reference signal Fref with the phase of output signal PLL_OUT.

Frequency divider 1035 multiplies the frequency of output signal PLL_OUT from VCO 1034 by 1/N (where N is an integer) and outputs the result of multiplication.

According to crystal oscillator start-up circuit 1000 shown in FIG. 10, VCO 1034 included in PLL 1030 is used as the external oscillator at the start-up of crystal oscillation unit 1010. Thus, the circuit may be simplified when compared to the case where an external oscillator is provided in addition to PLL 1030 for starting up the crystal oscillation unit 1010. The use of an existing PLL, instead of an additional external oscillator, may reduce a mounting area on a semiconductor wafer.

2.2 Second Modification

In the above embodiments, the oscillation by the external oscillator and the oscillation by the crystal oscillation unit are switched instantaneously by the switches. It is also possible to switch the oscillations seamlessly by gradually decreasing an effect of the oscillation by the external oscillator on the crystal oscillator and gradually increasing an effect of the oscillation by the crystal oscillation unit.

Figure 11:
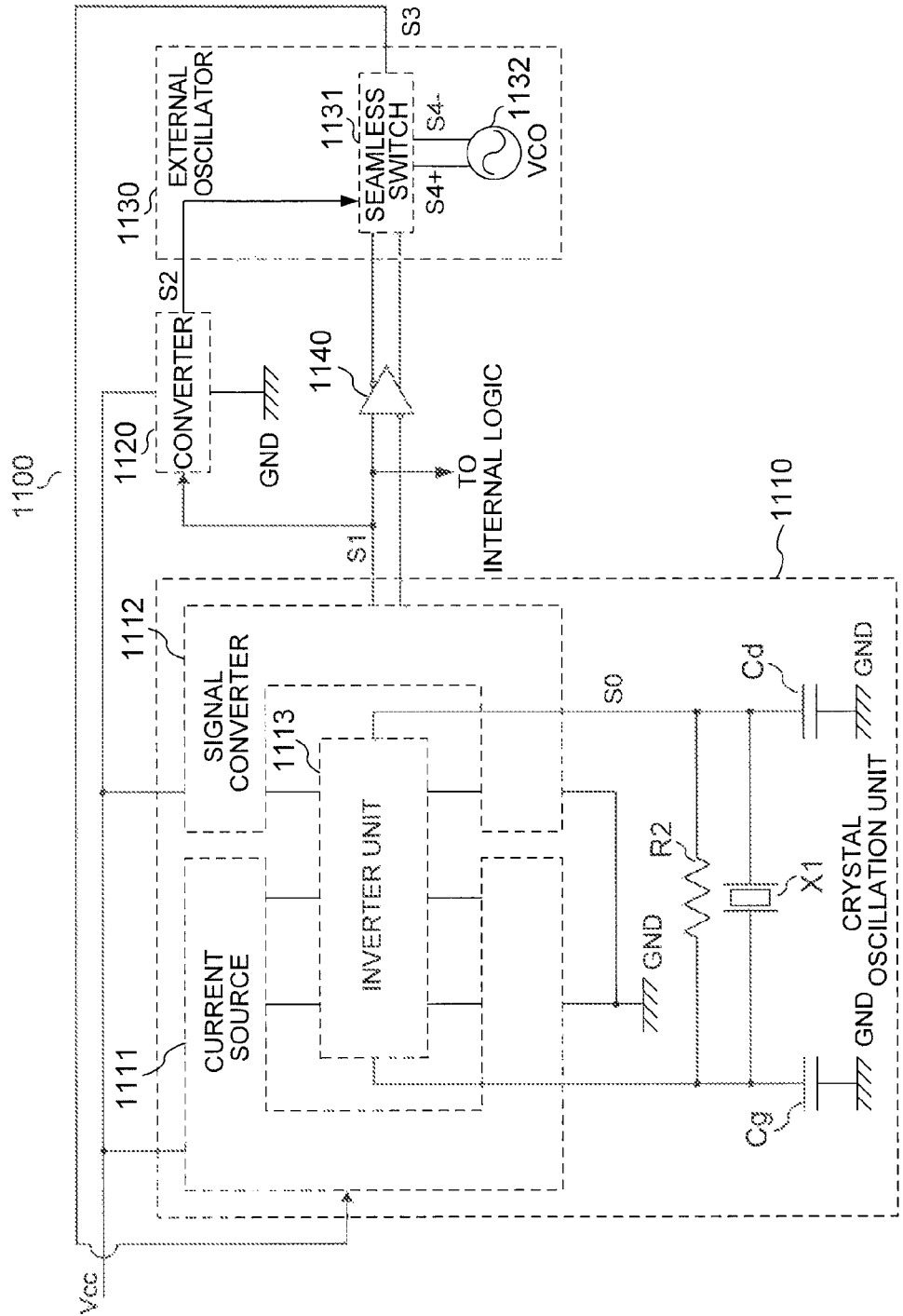
FIG. 11 is a diagram illustrating a crystal oscillator start-up circuit according to a second modification, according to an example embodiment.

FIG. 11 illustrates a configuration example of a crystal oscillator start-up circuit 1100 according to a second modification. The crystal oscillator start-up circuit 1100 includes a crystal oscillation unit 1110, a converter 1120, an external oscillator 1130 and an inverter 1140.

Crystal oscillation unit 1110 outputs from a node S1 an output signal corresponding to an oscillation by a crystal oscillator X1 to converter 1120 and inverter 1140. Crystal oscillation unit 1110 includes a current source 1111, a signal converter 1112 and an inverter unit 1113. In FIG. 11, Vcc is a power supply voltage, GND is ground, R2 is a resistor, and Cg and Cd are capacitors.

Crystal oscillator X1 is connected in parallel with resistor R2 for stable oscillation operation. Both ends of the parallel connection of crystal oscillator X1 and resistor R2 are respectively connected to one of the electrodes of capacitors Cg and Cd. The other electrodes of capacitors Cg and Cd are grounded. Further, both ends of crystal oscillator X1 and resistor R2 are respectively connected to input and output ends of inverter unit 1113, which includes a plurality of inverters.

Inverter unit 1113 has the function of amplifying and level-inverting a sine wave oscillated by the resonance of crystal oscillator X1 and capacitors Cd and Cg. A node to which one of the ends of crystal oscillator X1, resistor R2, inverter unit 1113 and capacitor Cd are connected is taken to be S0.

Figure 12:
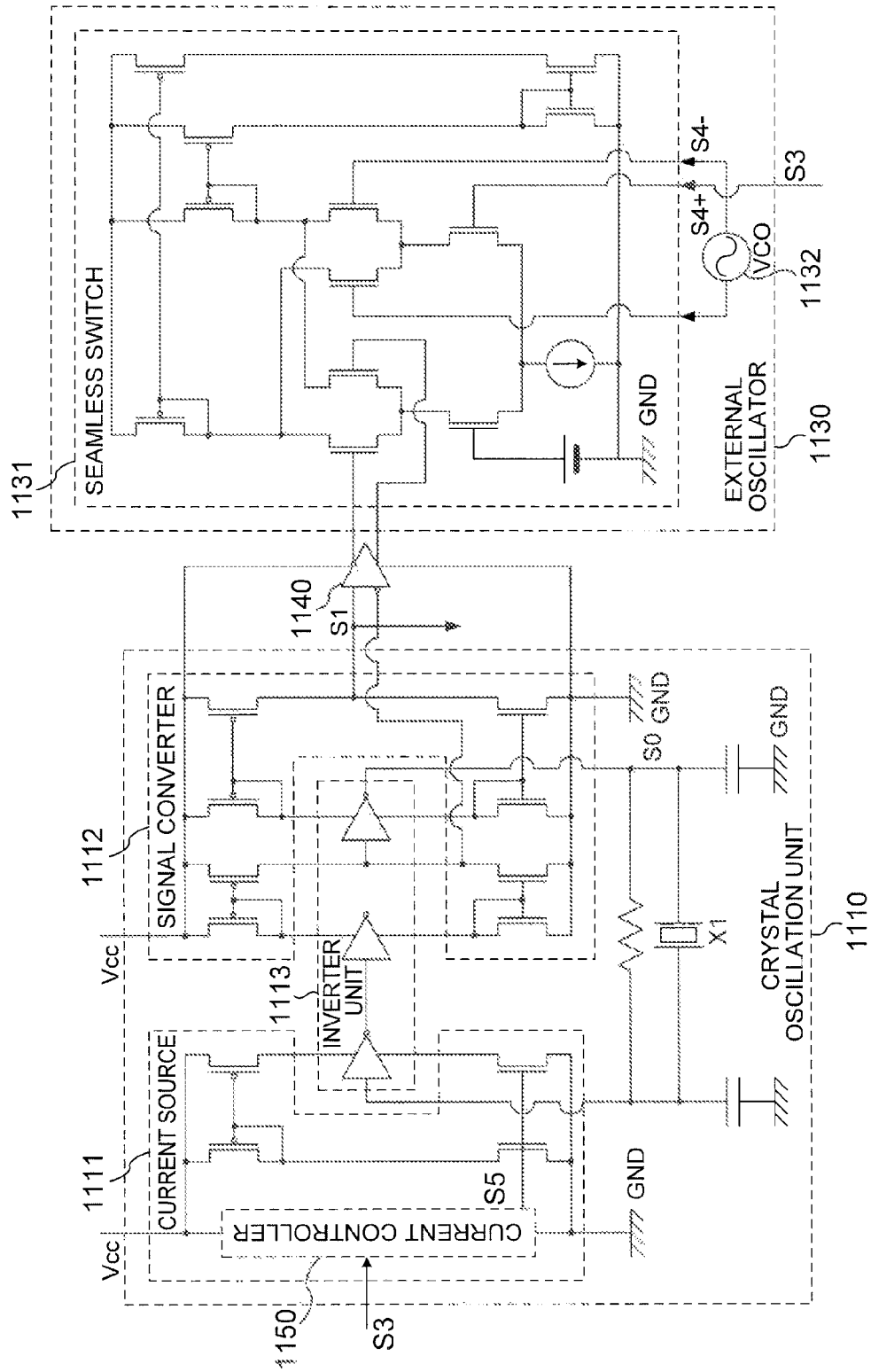
FIG. 12 is a diagram illustrating a part of the crystal oscillator start-up circuit illustrated in FIG. 11, according to an example embodiment.
Figure 13:
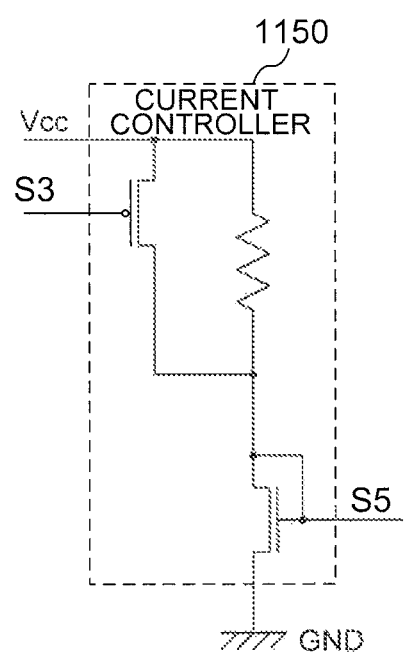
FIG. 13 is a diagram illustrating a part of the crystal oscillator start-up circuit illustrated in FIG. 11, according to an example embodiment.

Current source 1111 receives the input of the power supply voltage Vcc and supplies current to the inverters included in inverter unit 1113. At this time, current source 1111 supplies current corresponding to the amplitude of the output signal from the crystal oscillation unit 1110 to the inverters in response to the feedback of the voltage from external oscillator 1130. A node to which external oscillator 1130 and current source 1111 are connected is taken to be S3. A circuit configuration example of current source 1111 is illustrated in FIG. 12. A circuit configuration example of current controller 1150, included in current source 1111, is illustrated in FIG. 13.

While an odd number of three or more inverters are included in inverter unit 1113, current source 1111 supplies current to at least a first stage of inverter(s) through which a large through current flows, i.e., the inverter(s) arranged closest to the input side of inverter unit 1113. On the other hand, current source 1111 does not supply current to at least the last stage of the inverter(s) included in inverter unit 1113, i.e., the inverter(s) arranged closest to the output side of inverter unit 1113. In the example of FIG. 12, inverter unit 1113 includes three inverters. Current source 1111 supplies current to the first inverter of inverter unit 1113.

Signal converter 1112 supplies current to at least the last stage of inverter(s), through which a through current is decreased. Signal converter 1112 does not supply current to at least the first stage of inverter(s).

In FIG. 12, signal converter 1112 receives the input of power supply voltage Vcc and supplies current to the second and third inverters in inverter unit 1113. Signal converter 1112 thereby generates a voltage obtained by converting a change in signal amplitude to a change in DC voltage, and outputs the corresponding voltage to converter 1120 in FIG. 11 and an external circuit such as an internal logic. Further, signal converter 1112 outputs the corresponding voltage to external oscillator 1130 through inverter 1140. Here, a node to which signal converter 1112, converter 1120 and inverter 1140 are connected is taken to be S1. A circuit configuration example of signal converter 1112 is illustrated in FIG. 12.

Figure 14:
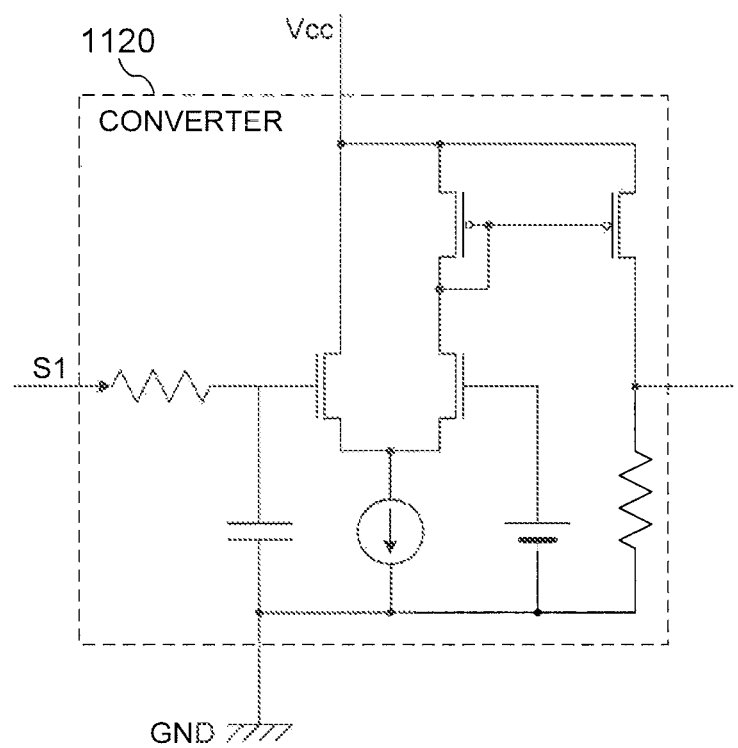
FIG. 14 is a diagram illustrating a part of the crystal oscillator start-up circuit illustrated in FIG. 11, according to an example embodiment.

Referring back to FIG. 11, converter 1120 converts the output signal from crystal oscillation unit 1110 to a voltage signal and outputs the voltage signal to a seamless switch 1131 of external oscillator 1130. A node to which converter 1120 and external oscillator 1130 are connected is taken to be S2. A circuit configuration example of converter 1120 is illustrated in FIG. 14.

Figure 15:
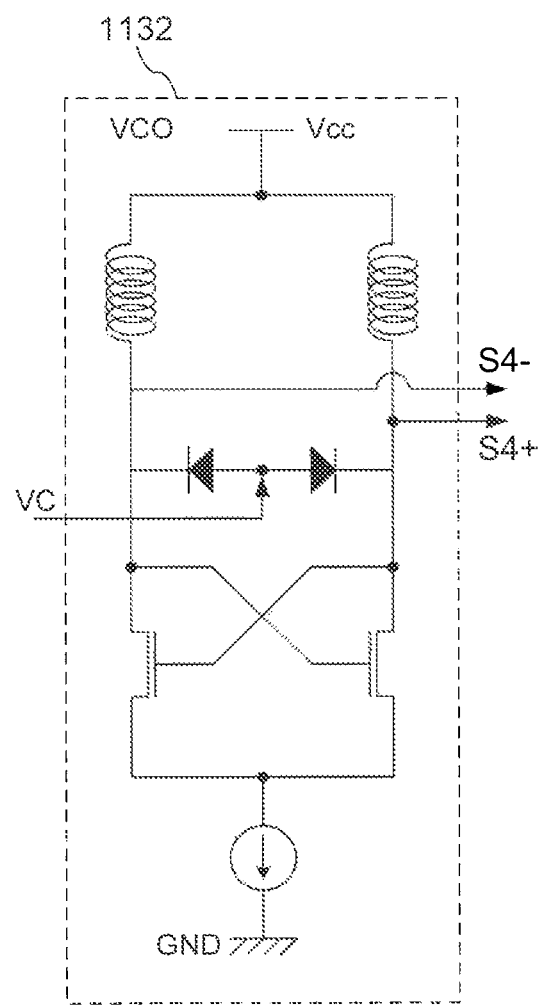
FIG. 15 is a diagram illustrating a part of the crystal oscillator start-up circuit illustrated in FIG. 11, according to an example embodiment.

External oscillator 1130 outputs to crystal oscillation unit 1110 an external oscillation signal of a frequency based on the voltage signal from converter 1120. Thus, the oscillation frequency of crystal oscillation unit 1110 is brought closer to the resonance frequency. External oscillator 1130 includes seamless switch 1131 and a VCO 1132. Circuit configuration examples of seamless switch 1131 and VCO 1132 are respectively shown in FIG. 12 and FIG. 15.

Seamless switch 1131 seamlessly switches between an oscillation signal from crystal oscillation unit 1110 via inverter 1140 and an oscillation signal from VCO 1132. More specifically, immediately after start-up, seamless switch 1131 increases the effect of the oscillation signal from VCO 1132 on crystal oscillation unit 1110. Thereafter, seamless switch 1131 gradually increases the effect of the oscillation signal from crystal oscillation unit 1110 and gradually decreases the effect of the oscillation signal from VCO 1132. Thus, as with the above embodiment, it is possible to excite crystal oscillation unit 1110 by the output signal from external oscillator 1130 and reduce the start-up speed of crystal oscillation unit 1110. External oscillator 1130 adjusts the frequency of the output signal supplied to crystal oscillation unit 1110 according to the output signal from crystal oscillation unit 1110. Crystal oscillation unit 1110 can be properly excited by this feedback control.

3 Conclusion

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A crystal oscillator start-up circuit, comprising:
a crystal oscillation unit configured to generate an output signal on a first node of the crystal oscillation unit according to an impedance characteristic of a crystal oscillator;
a converter configured to convert the output signal to a voltage signal corresponding to the impedance characteristic of the crystal oscillator and to output the voltage signal as a control signal, wherein the converter comprises:
a comparator coupled to the crystal oscillation unit, the comparator to compare the output signal to a voltage reference;
a transistor comprising a gate coupled to an output of the comparator, a source coupled to a power supply voltage, and a drain coupled to ground via a capacitor and a current source, respectively; and
a buffer amplifier comprising an input coupled to the drain of the transistor, the buffer amplifier to output the control signal; and
an external oscillator configured to generate an oscillation signal, a frequency of the oscillation signal being based on the control signal, and wherein the external oscillator configured to output the oscillation signal to a second node of the crystal oscillation unit, wherein the frequency of the oscillation signal is adjusted by the control signal to approach a resonance frequency of the crystal oscillator to bring a frequency of the output signal on the first node close to the resonance frequency of the crystal oscillator.

2. The crystal oscillator start-up circuit of claim 1, further comprising a first switch configured to stop supplying the oscillation signal to the crystal oscillation unit when an amplitude of the output signal is lower than a threshold.

3. The crystal oscillator start-up circuit of claim 1, wherein the external oscillator is configured to operate as a phase locked loop (PLL) when the crystal oscillator oscillates stably.

4. The crystal oscillator start-up circuit of claim 1, further comprising a second switch configured to switch the control signal between the output signal and a phase difference, wherein the phase difference is between the oscillation signal and the output signal.

5. The crystal oscillator start-up circuit of claim 1, further comprising a seamless switch configured to gradually lower an effect of the oscillation signal on the output signal.

6. A method for starting up a crystal oscillator, comprising:
generating, by a crystal oscillation unit, an output signal on a first node of the crystal oscillation unit according to an impedance characteristic of the crystal oscillator;
converting, by a converter, the output signal to a voltage signal corresponding to the impedance characteristic of the crystal oscillator, wherein the converting the output signal comprises comparing the output signal to a reference voltage by a comparator and outputting a control signal using a buffer amplifier, wherein an output of the comparator controls a gate of a transistor, the transistor comprising a source coupled to a power supply voltage and a drain coupled to ground via a capacitor and a current source, respectively; and
generating, by an external oscillator, an oscillation signal, a frequency of the oscillation signal being based on the control signal; and
outputting the oscillation signal to a second node of the crystal oscillation unit, wherein the frequency of the oscillation signal is adjusted by the control signal to approach a resonance frequency of the crystal oscillator to bring a frequency of the output signal on the first node close to the resonance frequency of the crystal oscillator.

7. The method of claim 6, further comprising:
using a first switch to stop supplying the oscillation signal to the crystal oscillation unit when an amplitude of the output signal is lower than a threshold.

8. The method of claim 6, wherein the external oscillator is configured to operate as a phase lock loop (PLL) when the crystal oscillator oscillates stably.

9. The method of claim 6, further comprising:
using a second switch to switch the control signal between the output signal and a phase difference, wherein the phase difference is between the oscillation signal and the output signal.

10. The method of claim 6, further comprising:
using a seamless switch to gradually lower an effect of the oscillation signal on the output signal.

11. A crystal oscillator start-up circuit, comprising:
a crystal oscillation unit configured to generate an output signal on a first node of the crystal oscillation unit according to an impedance characteristic of a crystal oscillator;
a converter configured to convert the output signal to a voltage signal corresponding to the impedance characteristic of the crystal oscillator and to output the voltage signal as a control signal, wherein the converter comprises:
an operational amplifier comprising a first input terminal coupled to the crystal oscillation unit, wherein an output of the operational amplifier is fed back to a second input terminal of the operational amplifier;
a transistor comprising a gate coupled to the output of the operational amplifier, a source coupled to a power supply voltage, and a drain coupled to ground via a capacitor and a current source, respectively;
a comparator comprising a first terminal coupled to the drain of the transistor and a second terminal coupled to a reference voltage, the comparator to output the control signal; and
an external oscillator configured to generate an oscillation signal, a frequency of the oscillation signal being based on the control signal, and wherein the external oscillator configured to output the oscillation signal to a second node of the crystal oscillation unit, wherein the frequency of the oscillation signal is adjusted by the control signal to approach a resonance frequency of the crystal oscillator to bring a frequency of the output signal on the first node close to the resonance frequency of the crystal oscillator.

12. The crystal oscillator start-up circuit of claim 11, further comprising a first switch configured to stop supplying the oscillation signal to the crystal oscillation unit when an amplitude of the output signal is lower than a threshold.

13. The crystal oscillator start-up circuit of claim 11, wherein the external oscillator is configured to operate as a phase locked loop (PLL) when the crystal oscillator oscillates stably.

14. The crystal oscillator start-up circuit of claim 11, further comprising a second switch configured to switch the control signal between the output signal and a phase difference, wherein the phase difference is between the oscillation signal and the output signal.

15. The crystal oscillator start-up circuit of claim 11, further comprising a seamless switch configured to gradually lower an effect of the oscillation signal on the output signal.

\* \* \* \* \*